US011288427B2

(12) United States Patent
Bhowmick et al.

(10) Patent No.: US 11,288,427 B2
(45) Date of Patent: Mar. 29, 2022

(54) AUTOMATED ROOT-CAUSE ANALYSIS, VISUALIZATION, AND DEBUGGING OF STATIC VERIFICATION RESULTS

(71) Applicant: Synopsys, Inc., Mountain View, CA (US)

(72) Inventors: Sauresh Bhowmick, Bangalore (IN); Sanjay Gulati, Noida (IN); Sourasis Das, Bangalore (IN); Bhaskar Pal, Bangalore (IN); Rajarshi Mukherjee, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 159 days.

(21) Appl. No.: 16/814,342

(22) Filed: Mar. 10, 2020

(65) Prior Publication Data
US 2020/0349311 A1  Nov. 5, 2020

Related U.S. Application Data

(63) Continuation of application No. 16/242,746, filed on Jan. 8, 2019, now Pat. No. 10,586,001.

(51) Int. Cl.
*G06F 7/50* (2006.01)
*G06F 30/3323* (2020.01)
*G06N 20/00* (2019.01)
*G06T 11/20* (2006.01)

(52) U.S. Cl.
CPC ........ *G06F 30/3323* (2020.01); *G06N 20/00* (2019.01); *G06T 11/206* (2013.01)

(58) Field of Classification Search
USPC ............... 716/52, 102, 106, 112, 104, 108
See application file for complete search history.

(56) References Cited

U.S. PATENT DOCUMENTS

| 6,704,912 | B2 * | 3/2004 | Narain | G06F 30/33 |
| | | | | 716/106 |
| 10,078,723 | B1 * | 9/2018 | Ghosh | G06F 30/398 |
| 2007/0079266 | A1 * | 4/2007 | Devineni | G06F 30/398 |
| | | | | 716/112 |
| 2007/0101303 | A1 * | 5/2007 | Lien | G06F 30/398 |
| | | | | 716/52 |

(Continued)

*Primary Examiner* — Brian Ngo
(74) *Attorney, Agent, or Firm* — Sterne, Kessler, Goldstein & Fox P.L.L.C.

(57) ABSTRACT

Disclosed herein are system, method, and computer-readable storage device embodiments for implementing automated root-cause analysis for static verification. An embodiment includes a system with memory and processor(s) configured to receive a report comprising violations and debug fields, and accept a selection of a seed debug field from among the plurality of debug fields. Clone violations may be generated by calculating an overlay of a given violation of the violations and a seed debug field, yielding possible values for a subset of debug fields. A clone violation may be created for a combination of the at least two second debug fields, populating a projection matrix, which may be used to map violations and clone violations to corresponding numerical values in the projection matrix and determine a violation cluster based on the mapping having corresponding numerical values and score(s) satisfying a threshold, via ML. Clustering may further be used to generate visualizations.

20 Claims, 7 Drawing Sheets

(56) References Cited

U.S. PATENT DOCUMENTS

| | | | |
|---|---|---|---|
| 2013/0019216 A1* | 1/2013 | Vasudevan | G06F 30/3323 716/106 |
| 2014/0337836 A1* | 11/2014 | Ismael | G06F 9/45558 718/1 |
| 2019/0065991 A1* | 2/2019 | Guggilla | G06N 20/00 |

* cited by examiner

200

```
- <Violation id="4" displayWidth="20" display="ISO_STRATEGY_MISSING" record="1" type="ISO_STRATEGY_MIS
    <Header compressed="0" waived="0" display="ISO_STRATEGY_MISSING" severity="error" count="3"/>
  - <Objects>
      <Item display="Tag" type="Tag">ISO_STRATEGY_MISSING</Item>
      <Item display="Description" type="Description">Isolation required on crossing from [Source] to [Sin
      <Item display="Violation" type="Violation">LP:4</Item>
    + <Record display="Source" type="SEGMENT_SOURCE">
      <Item display="Sink" type="SEGMENT_SINK">i_core2/core2_and/A</Item>
      <Item display="SegmentSourceDomain" type="SEGMENT_SOURCE_DOMAIN">top_pd</Item>
      <Item display="SegmentSinkDomain" type="SEGMENT_SINK_DOMAIN">i_core2/core2_pd</Item>
    + <Record display="LogicSource" type="LOGICAL_SOURCE">
      <Item display="LogicSink" type="LOGICAL_SINK">i_core2/core2_and/A</Item>
      <Item display="DomainSource" type="DOMAIN_SOURCE">top_i3</Item>
      <Item display="DomainSink" type="DOMAIN_SINK">i_core2/core2_i1</Item>
    - <Record display="SourceInfo" type="SOURCE_SUPPLY_INFO">
      - <Record display="PowerNet" type="PWR_NET">
          <Item display="NetName" type="NET_NAME">top_pd_ss.power</Item>
          <Item display="NetType" type="NET_TYPE">UPF</Item>
        </Record>
        <Item display="PowerMethod" type="PWR_RESOLVE_TYPE">FROM_UPF_DRIVER_SUPPLY</Item>
      - <Record display="GroundNet" type="GND_NET">
          <Item display="NetName" type="NET_NAME">core1_pd_ss.ground</Item>
          <Item display="NetType" type="NET_TYPE">UPF</Item>
        </Record>
        <Item display="GroundMethod" type="GND_RESOLVE_TYPE">FROM_UPF_DRIVER_SUPPLY</Item:
      </Record>
    - <Record display="SinkInfo" type="SINK_SUPPLY_INFO">
      - <Record display="PowerNet" type="PWR_NET">
          <Item display="NetName" type="NET_NAME">core2_pd_ss.power</Item>
          <Item display="NetType" type="NET_TYPE">UPF</Item>
        </Record>
        <Item display="PowerMethod" type="PWR_RESOLVE_TYPE">FROM_UPF_POWER_DOMAIN</Item>
      - <Record display="GroundNet" type="GND_NET">
          <Item display="NetName" type="NET_NAME">core1_pd_ss.ground</Item>
          <Item display="NetType" type="NET_TYPE">UPF</Item>
        </Record>
        <Item display="GroundMethod" type="GND_RESOLVE_TYPE">FROM_UPF_POWER_DOMAIN</Item:
      </Record>
    + <List display="States" type="STATE_LIST">
  </Objects>
</Violation>
```

FIG. 2

```
Tag                           : CLUSTER_LP_VIOLATION                                              400
Description                   : Set of violations for which the root cause is same
Violation                     : LP:625
ClusterRank                   : 7
CauseViolCount                : 3
EffectViolCount               : 32
EffectViolCoverage            : 5.66% (35/618)
EffectViolCumulativeCoverage  : 97.41% (602/618)
CauseViolList
  CauseViol
    ViolTag                   : DEBUG_PDLSPOL_REDUND
    ViolCount                 : 1
    ViolID                    : 618
    DebugClue                 : Is level shifter strategy needed to be instrumented
                                on boundary elements of power domain { GENPP } ?

CauseViol
    ViolTag                   : DEBUG_SUPPLY_ON
    ViolCount                 : 1
    ViolID                    : 4
    DebugClue                 : Is supply net { VDD } supposed to be always ON in system power state?
  CauseViol
    ViolTag                   : DEBUG_SUPPLY_UNUSED
    ViolCount                 : 1
    ViolID                    : 14
    DebugClue                 : Is it correct to drop voltage value { VDDGS }
                                of supply { 0.864 0.864 0.864 } during PST merging?
EffectViolList
  EffectViol
    ViolTag                   : LS_STRATEGY_REDUND
    ViolCount                 : 32
    ViolID                    : 127,173,177,194,224,233,245,279,316,361,374,377,379,
                                381,391,394,403,410,430,435,437,443,445,454,462,469,
DominantDebugFieldSequence
  DominantDebugField
    DebugFieldName            : LogicSinkParentInstance
    DebugFieldValueList
      DebugFieldValue         : Multiplier/GENPP
  DominantDebugField
    DebugFieldName            : LogicSourceParentInstance
    DebugFieldValueList
      DebugFieldValue         : GPRs
  DominantDebugField
    DebugFieldName            : SegmentSinkDomain
    DebugFieldValueList
      DebugFieldValue         : GENPP
```

FIG. 4

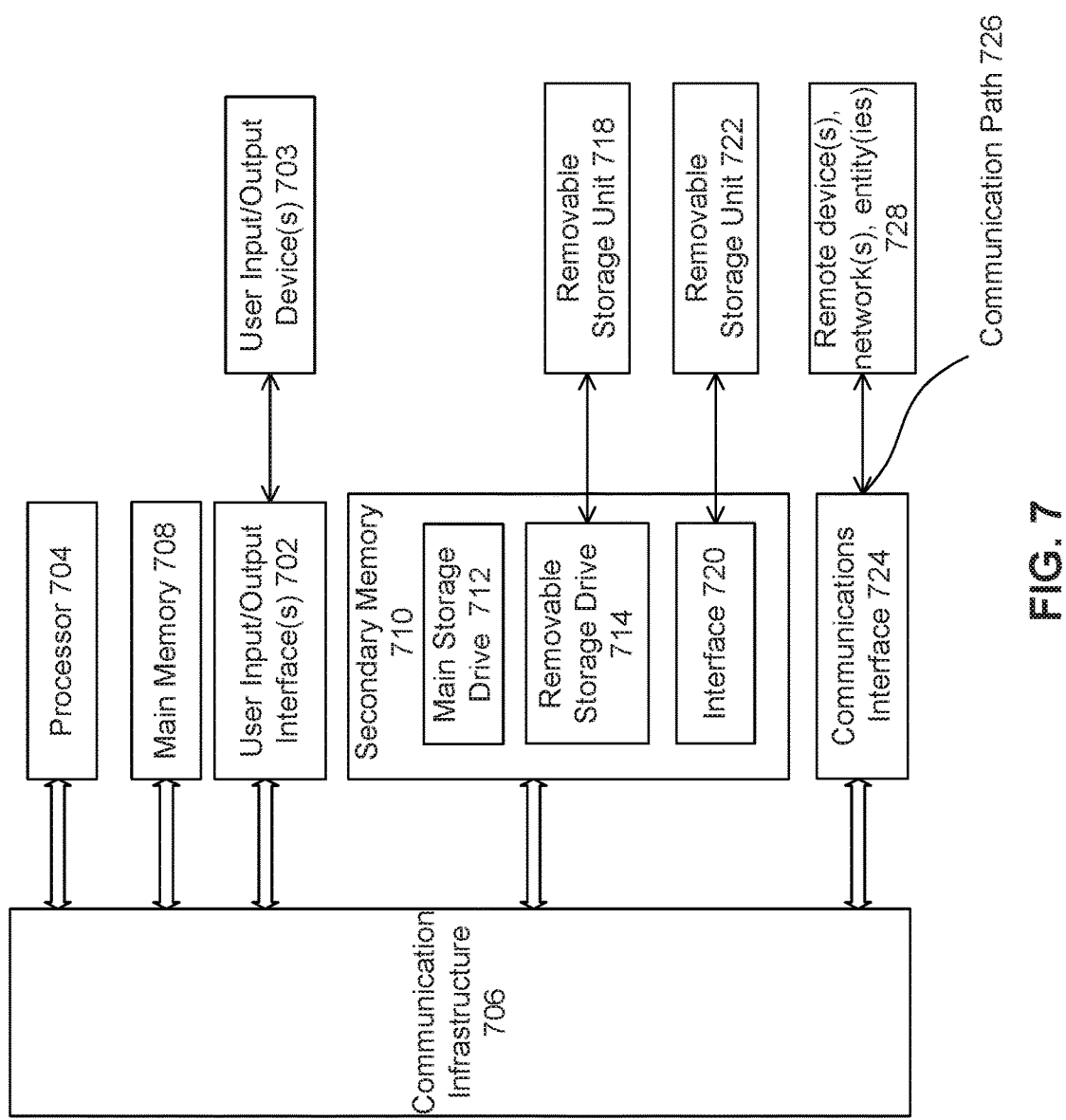

AUTOMATED ROOT-CAUSE ANALYSIS, VISUALIZATION, AND DEBUGGING OF STATIC VERIFICATION RESULTS

CROSS-REFERENCE TO RELATED APPLICATIONS

This application is a continuation of U.S. patent application Ser. No. 16/242,746, filed Jan. 8, 2019, which was issued as U.S. Pat. No. 10,586,001, the entirety of which is incorporated herein by reference.

BACKGROUND

Static verification tools, available in EDA systems, are used by circuit designers to be in compliance with design specifications of various aspects of circuit designs, such as low power, asynchronous clocks, functionality, style, and structure, for example.

Typical designs may vary in complexity. For example, the number of digital logic gates may range from dozens to billions. Similarly, auxiliary data associated with power formats and clocks that may be required for static verification may also be very complex.

Static verification tools typically take a design and any auxiliary data as input, perform complex analysis, and produce reports containing many separate messages, including information about potential violations of conformance with design specifications. Each message or violation may indicate some problem in the design or auxiliary data, or in their interaction, and may have one or more fields containing at least one pointer to a part of the design, a part of auxiliary data, or both.

A typical verification tool report may contain thousands or millions of messages or violations. To progress toward a solution, a designer may typically analyze the report manually, sort or group the reported messages or violations, and make guesses or inferences to try to deduce at least one root cause of the violations. Typically, manual analysis may be aided by techniques such as visual display of the design and/or any auxiliary data, tracing of the design, knowledge of the design and any auxiliary data, knowledge of the domain, using additional commands provided by the static verification tools, or any combination of the above techniques. Typically, domain knowledge refers to the experience gathered in an area of work, such as static verification of compliance with low-power specifications, linting, or clock-domain crossing (CDC), to name a few examples. This manual process may be slow and error-prone. For example, unrelated violations may be grouped together, which may cause added difficulty in identifying root causes or determining which violations are root-cause violations.

Root-cause analysis may play a large role in facilitating solutions of problems in circuit designs that result in violations at the verification stage. For at least the reasons described above, conventional static verification tools tend to be inefficient, slow, and costly with respect to root-cause analysis, adding to the overall cost of circuit design and verification.

SUMMARY

Some embodiments disclosed herein enable computer technology that may, using machine learning (ML), automatically group violations or messages in reports produced by static verification tools. Higher-level violations may be cloned and enriched automatically based on domain knowledge, allowing automatic root-cause detection for violation groups. Although some embodiments described below refer to low-power specifications, e.g., UPF as defined below, the same approach may be used for any other kind of static verification tools in other embodiments, e.g., CDC checkers or linters, to name a few non-limiting examples.

These root-causes may be displayed, for example, in a graphical user interface (GUI) allowing for improved comprehension and debugging of a given group of violations. In addition, dominant violation fields causing a violation group may be identified automatically. These fields may improve efficiency of debugging significantly for a given violation group. The fields may be highlighted on demand using the GUI or an element thereof, such as a schematic viewer.

In an embodiment of a system, at least one computer processor may be coupled to a memory and configured to receive a report comprising a plurality of violations and a plurality of debug fields and accept a selection of a seed debug field from among the plurality of debug fields. From this report and selection, the processor may be further configured to generate a plurality of clone violations, by calculating, via an overlay mechanism, an overlay of a given violation of the plurality of violations and a seed debug field.

The overlay mechanism may yield a plurality of possible values for a subset of the plurality of debug fields. A given clone violation may be created by the processor for a given combination of the at least two second debug fields, which may be used to populate a projection matrix. The projection matrix may be used to produce a mapping of the plurality of violations and the plurality of clone violations to corresponding numerical values in the projection matrix and determine a violation cluster based on the mapping having a set of corresponding numerical values having one or more scores satisfying at least one score threshold, via an ML algorithm. The clustering may further be used to generate visualizations, in some embodiments.

BRIEF SUMMARY OF THE DRAWINGS

The accompanying drawings are incorporated herein and form a part of the specification.

FIG. 2 depicts an example of a static verification violation and corresponding debug fields, according to some embodiments.

FIG. 4 depicts an example of a cluster of static verification violations, according to some embodiments.

FIG. 7 depicts an example computer system useful for implementing various embodiments.

In the drawings, like reference numbers generally indicate identical or similar elements. Additionally, generally, the left-most digit(s) of a reference number identifies the drawing in which the reference number first appears.

DETAILED DESCRIPTION

Figure 1:
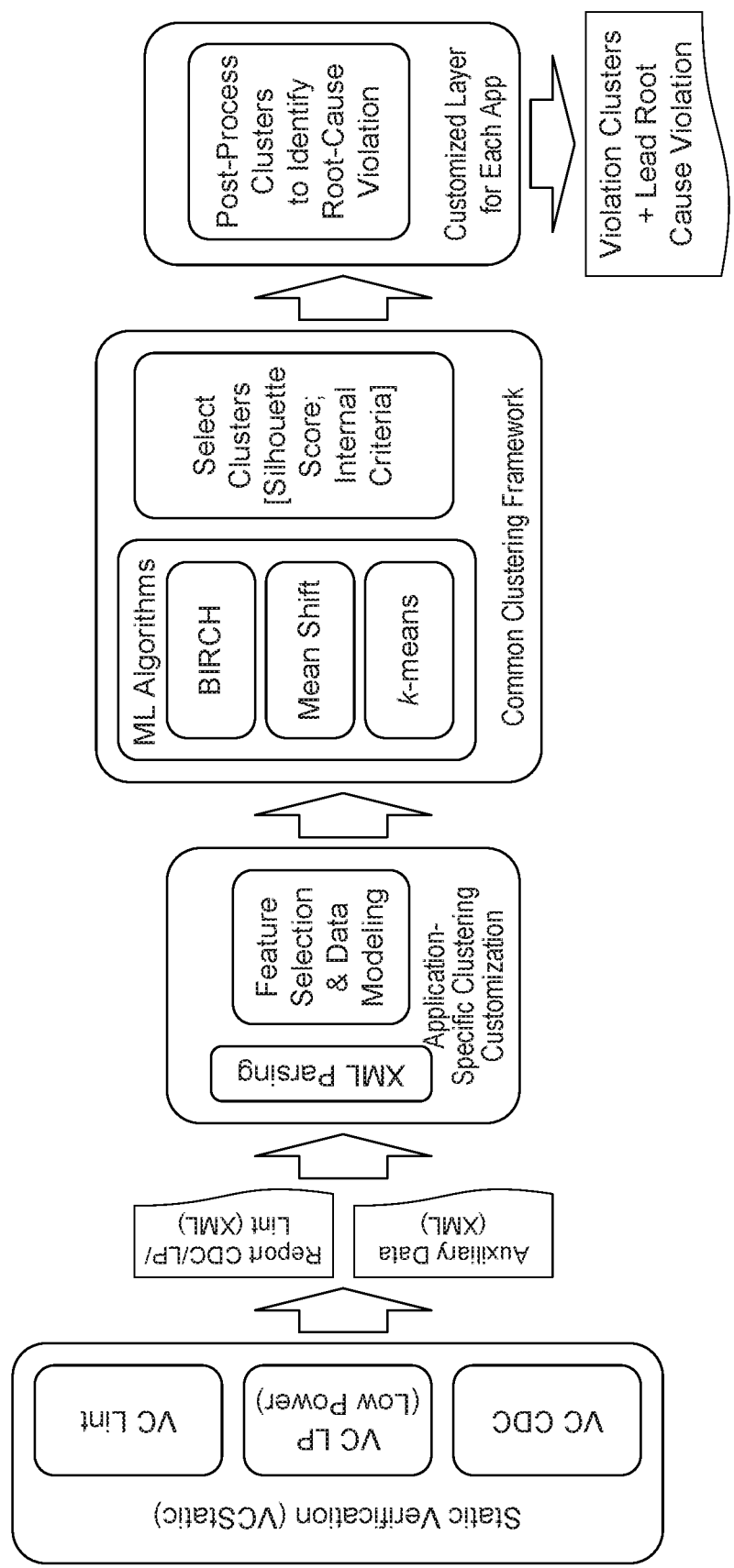
FIG. 1 depicts an overall workflow for some of the embodiments disclosed herein.

FIG. 1 depicts an overall workflow 100 for some of the embodiments disclosed herein. The ML algorithm flow is also shown in FIG. 1.

1. Selection of Features from Violation Reports Produced by Static Verification Tools A violation may have a set of debug fields. The debug fields may correspond to the design and/or to the auxiliary data, such as formatted data in Unified Power Format (UPF) specified by the IEEE 1801 standard, and may be useful to understand and debug the violation. A designer may choose a subset (e.g., one or more) of these debug fields which may represent a violation appropriately to ML algorithms. This selection of features for a violation tag is driven by the domain knowledge of static verification tools. FIG. 2 depicts an example XML, representation 200 of a violation and corresponding debug fields. A low-power violation report may be generated by a static verification tool, for example, to identify violations of compliance with a low-power circuit design specification. This low-power violation report may be an input for an automated root-cause analysis tool. An output of the automated root-cause analysis tool may include a set of clusters of violation instances from the low-power violation report. The output may then be used by another tool or module of a static verification tool, for example, to assist a circuit designer with more advanced debugging. A violation report as input in XML format may be parsed to extract the information, although other formats (JSON, structured or unstructured text, databases, binary representations, or the like, to name a few non-limiting examples) may be used additionally or alternatively for the similar purposes. A typical violation report in XML format may look like the listing of FIG. 2.

2. Enrichment or Cloning of Violations Based on Domain Knowledge to Facilitate Root-Cause Analysis Enrichment and/or cloning of violations may be used to perform automated root-cause detection.

Violations can be of different types. The debug fields of a certain violation type may differ from those of another violation type. Debug field types for a certain kind of violation may be chosen carefully such that a designer debugging the violation may clearly understand the issue pointed to by the violation itself.

For example, a Low Power checker may generate UPF-based, UPF+Design-based, and Design-based violations. UPF-based violations do not require any design-based debug fields. Additionally, adding design-related information to a UPF-based violation may lead to an explosion of tool-generated data and increase the debug time to find out the actual UPF issue. In other embodiments, similar concepts may be applied to CDC checking and/or linting in addition to or instead of UPF or low-power specification compliance.

This variation in occurrence of debug fields for different violation types poses the following challenges to the clustering methods.

A. Due to the absence of certain fields in certain violations, one may need to 0-pad missing values or use some other imputation method for ML. This can lead to poor cluster quality, such as including spurious results. Therefore, this is not desirable.

B. A single violation at the UPF level may lead to many violations when the UPF is applied to the design. Similarly, a single violation related to a library cell may manifest itself as many design-level violations. There is an inherent cause and effect relationship between a small number of violations at a higher level (like UPF or library cells) with many violations at a lower level. If captured, this relationship may enable a designer to detect root causes from groups of violations automatically.

However, the absence of design related information in a UPF based violation makes it impossible to link UPF based violations to Design/Design+UPF related violations. Any tool that enables this link can identify a representative UPF violation and fixing it may lead to solving many UPF+Design/Design based violations (i.e., faster convergence of design bugs). This association between heterogeneous violations is not possible without adding additional/adequate information (i.e., additional debug field values). This justifies why "cloning" may be needed.

To address the above needs, for some of the embodiments disclosed herein, under a special mode, the Static Verification tool may execute the following steps:

1) Some debug fields for every violation type (e.g. UPF-based violation) may be marked as seed debug fields. Choice of seed debug fields may be based on domain knowledge of the Static Verification tool. Usually, a debug field (sometimes more than one) may be present in every UPF level violation which summarizes the whole violation (for example, Supply, Pin, etc.). Using this debug field, the area of impact may be determined for that UPF level violation.

The mapping between a violation and the seed debug field may be fixed, and may be predetermined, such as by a domain expert, in some embodiments. This mapping may be captured in an XML file and the automatic process may use that XML to determine the seed debug field for a UPF level violation.

2) The associated violations are then enriched/cloned by the tool by adding relevant design/auxiliary data associated to these seed debug fields. Seed debug field(s) may be a key to find associated design violations corresponding to a UPF level violation, for example. The automated method of "cloning" may start with at least one seed debug field, and with that debug field(s) may trace the design to find any areas that may be being impacted by that UPF level violation. These design specific field values (like UPF, clock) are added to the original UPF violation to create clone violations of the original UPF violation.

This enrichment/cloning step for a violation is triggered by the presence of one or more chosen seed debug fields in the violation. A cloned and enriched higher-level violation (e.g., a violation from the level of UPF or library cells) may now cluster with lower-level violations like the ones from the design-level. After cloning, the cloned UPF level violations may acquire design specific information. On the other hand, design level violations already possess design specific information. With this setup, any two violations which contain a similar debug field value may automatically be grouped together in the same cluster. This may lead to high-quality clusters that automatically capture the root-causes for each cluster by bring the cause violation(s) and effect violation(s) into the same cluster.

This enriching or cloning process may not be violation specific. It may be seed debug field (feature) specific. So, any violation which uses a seed feature may be automatically cloned by the tool. This may help in removing human bias from the clustering/root cause analysis process. Enriching or cloning may automatically add additional information in the violations based on the seed features without bias and may leave the violation association or grouping tasks to the ML clustering engine.

It may be appreciated to one of ordinary skill in the art that a static verification tool report may not include violations or messages that are cloned by default since this may cause an explosion of tool-generated data making debugging by a designer impossible. But cloning (cloning and enriching may be similar or equivalent, in some embodiments) may allow high-quality analysis by ML algorithms and automated root-cause identification. Enriching or cloning of data may allow for clustering violations or generating streamlined error reports of any static tool in EDA. It may help to connect different violation types or error types by automatically supplying adequate information for heterogeneous data, thereby, enhancing the ML engine's decision-making and root-causing ability. In a normal usage of the tool, enriching or cloning may not be required. Conversely, these enriching or cloning steps may lead to an explosion of data that may make human debugging more difficult.

In the following example, enrichment or cloning in a Low Power verification tool is described. The tool may start with a UPF based violation. Suppose the seed debug field is POLICY. The tool may find possible values of other pertinent debug fields for the given POLICY. Under a special mode, in some embodiments, a variable may be added to the tool. Turning that variable ON may enable this special mode. For each such possible combination of additional discovered debug fields, the tool may create a new clone violation from the original violation. Starting with the seed debug field, the tool may trace the design to find additional debug fields. The algorithm to find other debug fields may be driven by low power knowledge. These custom algorithms may then be added to the existing static verification tools so that they may automatically populate the additional debug field values from a seed debug field value, even without knowledge of what the additional values may be. It may be possible to create clone violations by taking a cross-product of possible debug field values. Here, the cross-product may also serve as an example of an overlay mechanism for a design overlay of seed debug fields of root cause violations.

Figure 3:
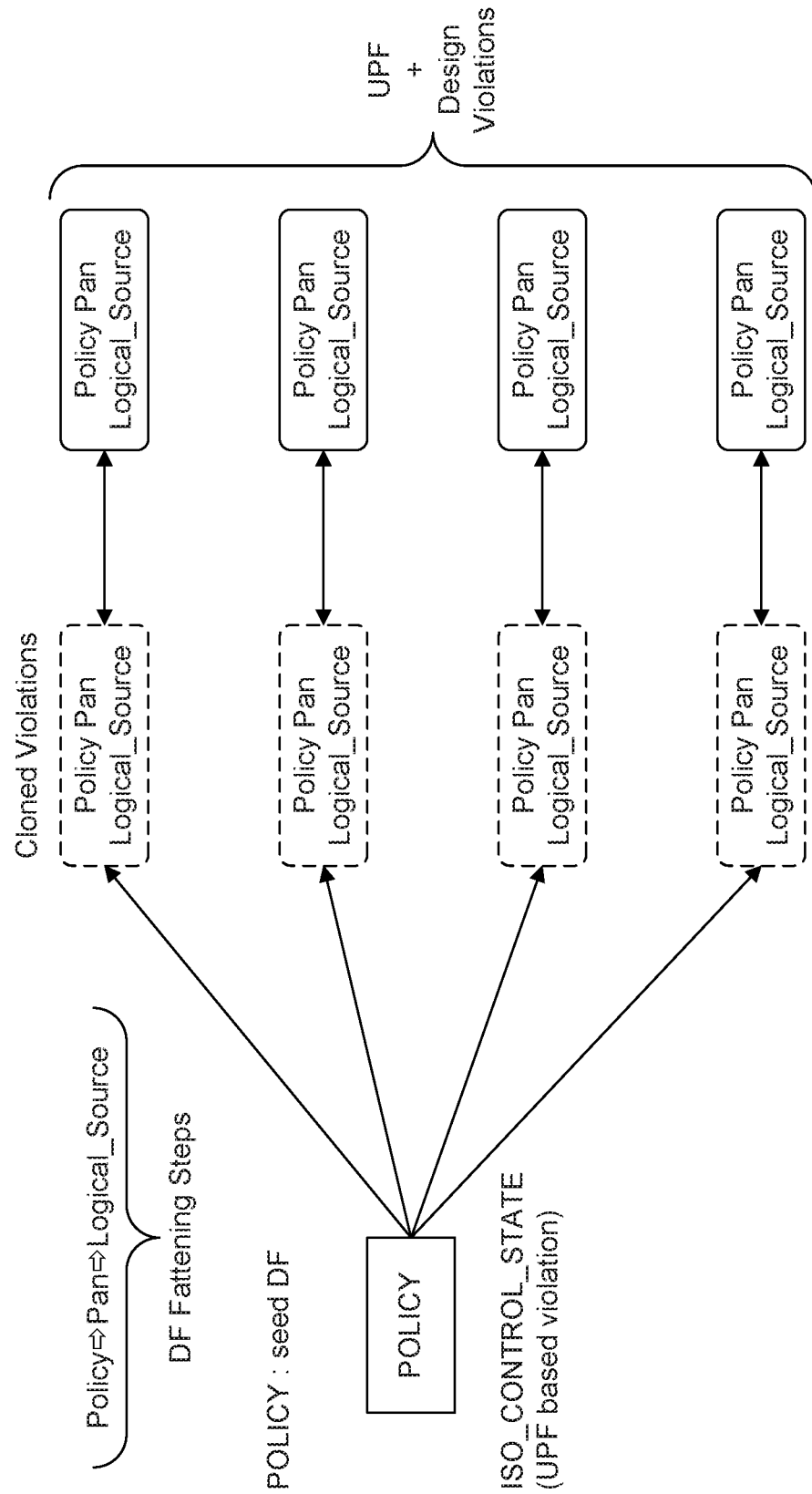
FIG. 3 depicts an example of creating a clone of a static verification violation, according to some embodiments.

FIG. 3 depicts an example 300 of creating a clone violation, using the example of the ISO_CONTROL_STATE violation, which is a UPF-based violation. Suppose the only debug field present in it is POLICY, whereas the UPF+Design/Design violations have debug fields POLICY, Policy-association-node (PAN) and LOGICAL_SOURCE populated for them. PAN and LOGICAL_SOURCE are design-based fields. Clearly, in its original form, the ISO_CONTROL_STATE violation will not form clusters with UPF+Design or design-based violations because it does not have the required fields. For such design-level violations, the static verification tool may populated these values POLICY may be chosen as a seed debug field, in some embodiments, by a user (e.g., designer) having domain knowledge. Starting from POLICY, the tool may automatically deduce all possible PAN debug field values associated with the POLICY debug field value. For each PAN value, the tool may deduce the associated LOGICAL_SOURCE debug field values. For each possible unique combination of PAN and LOGICAL_SOURCE values, the tool may generate a clone (unique clone) of the original ISO_CONTROL_STATE violation. A unique clone means that no two clone violations have the same combination of additional debug fields. For example, debug field A may have possible values {U, V} and debug field B may have possible values {Y, Z}. In some embodiments, four clone violations may be created with value pairs {U, Y}; {U, Z}; {V, Y}; and {V, Z}.

Addition of design-related information (PAN and LOGICAL_SOURCE in this example) to the clones of the original ISO_CONTROL_STATE violation may enable the clones to cluster with violations from UPF+Design and Design stages, as they have common feature/debug field values populated for them.

3. Modeling of Data for ML

Public-domain literature on ML proposes several techniques to map text strings into integers or real numbers. Some of the embodiments disclosed herein may use a variant of these techniques to map violation fields into real numbers, further described below. Once that is done, the violations may be plotted in a K-dimensional Euclidean space where there are K unique field types and the ML algorithms may be applied.

This step describes how the categorical debug field values (like VDD, VSS etc.) may be mapped to numeric values, by honoring their inter-relation getting reflected from the violation summary report, so that these become consumable by various ML algorithms.

After violation report parsing is performed, debug field values that use the same type of values and together may potentially contribute towards the root cause of a violation may be bucketized together. For a given violation type (e.g., ISO STRATEGY MISSING), a subset of debug fields may be selected to be used as "features" for ML. Selection of features for a certain type of violation may be driven by domain knowledge of static verification.

For example, for Low Power the categories may appear as shown below in Table 1.

TABLE 1

| Category Name | Debug Fields in that Category |
|---|---|
| LogicSourceSink | LogicSource |
| | LogicSink |
| SourceSinkSupply | SourceSupplyPower |
| | SourceSupplyGround |
| | SinkSupplyPower |
| | SinkSupplyGround |

Next, a lookup table may be created containing possible unique values those debug fields can assume. The lookup table may serve as an example of a projection matrix with violations mapped to debug fields, in some embodiments. Other embodiments of the projection matrix may serve the same purposes without departing from the scope of this disclosure.

In an embodiment, in the violation example of FIG. 2, SourceInfo/PowerNet/NetName and SinkInfo/PowerNet/NetName debug fields may use the same type of value, specifically, a signal name such as top_pd_ss.power, to name one example. A typical lookup table may appear as shown in the following Table 2:

TABLE 2

| top_pd_ss.power | 0 |
| core1_pd_ss.power | 2 |
| core2_pd_ss.power | 3 |
| top_pd_ss.ground | 1 |

There may be multiple such lookup tables similar to Table 2 generated for a given violation report.

In some embodiments, results of static verification may be parsed and fed into an algorithm designed to populate a K×N table, using a counting method, where N is the number of violations and K is the number of unique field values collected in the previous step. For each unique field value, the algorithm may fill in an integer J in the table for a given violation where the value occurs J times in the violation.

For each unique field value, the table gives its position in an N-dimensional Euclidean space.

Figure 5:
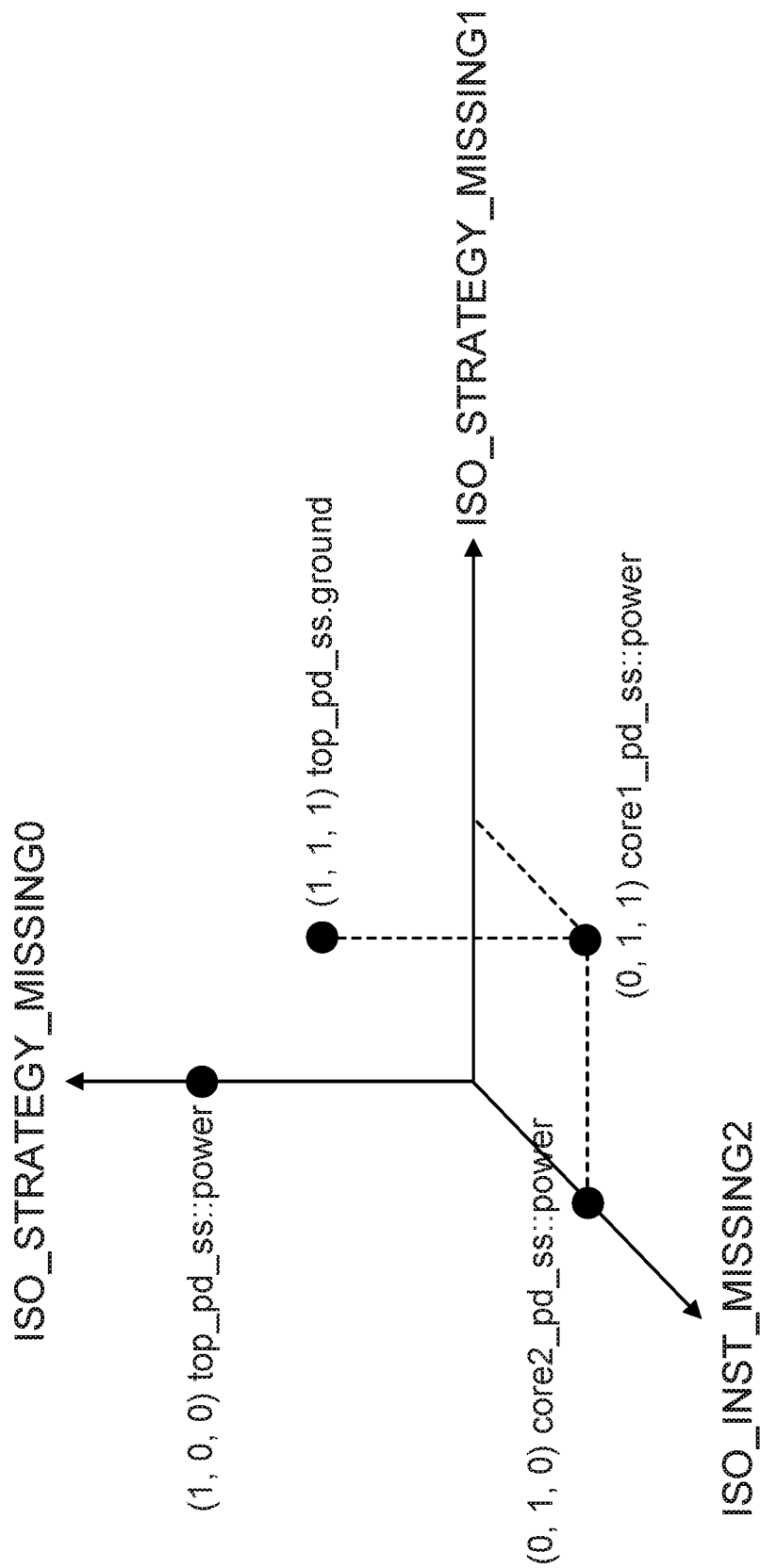
FIG. 5 depicts a violation visualization in 3-D space.

For a violation report with three violations we may visualize the coordinates of the debug field values in a 3-D space (for three violations here), as shown by the coordinate system 500 in FIG. 5.

The 4×3 table for this diagram may appear as shown in the following Table 3:

TABLE 3

|  | ISO_S..<br>MISSING0 | ISO_I..<br>MISSING2 | ISO_S..<br>MISSING1 |
| --- | --- | --- | --- |
| top_pd_ss.power | 1 | 0 | 0 |
| top_pd_ss.ground | 1 | 1 | 1 |
| core2_pd_ss.power | 0 | 1 | 0 |
| core1_pd_ss.power | 0 | 1 | 1 |

Having the same value along an axis signifies two debug field values are close to each other with respect to that violation. However, 0 value along a particular axis may indicate that two debug field values may be unrelated, even if they are geometrically close. To accommodate this idea in the data model, a new axis may be added called zero-count axis. Debug field values along this axis may be the total number of axes along which its value is zero, normalized by some factor. A resulting enhanced projection table may appear as shown in the following Table 4:

TABLE 4

|  | ISO_S..<br>MISSING0 | ISO_I..<br>MISSING2 | ISO_S..<br>MISSING1 | Zero-<br>Count |
| --- | --- | --- | --- | --- |
| top_pd_ss.power | 1 | 0 | 0 | 1 |
| top_pd_ss.ground | 1 | 1 | 1 | 2.298 |
| core2_pd_ss.power | 0 | 1 | 0 | 2.298 |
| core1_pd_ss.power | 0 | 1 | 1 | 1 |

Next, the Euclidean distance may be computed between each pair of unique debug field values to create a new distance matrix, as shown in the following Table 5:

TABLE 5

|  | top_pd_<br>ss.power | top_pd_<br>ss.ground | core2_pd_<br>ss.power | core1_pd_<br>ss.power |
| --- | --- | --- | --- | --- |
| top_pd_ss.power | 0 | 1.919 | 1.919 | 1.732 |
| top_pd_ss.ground | 1.919 | 0 | 1.414 | 1.414 |
| core2_pd_ss.power | 1.919 | 1.414 | 0 | 1.638 |
| core1_pd_ss.power | 1.732 | 1.414 | 1.638 | 0 |

For each bucket of debug field values, one such distance matrix may be present.

A distance matrix is an indicator of spatial proximity of two debug field values. Small distances may indicate two debug field values are highly correlated. Next, the debug field values may be mapped into real numbers such that their mutual distance relationship defined in the previous table is honored as closely as possible. An ML method called Multi-Dimensional Scaling (MDS) may be used to perform this mapping.

After MDS is performed, a numeric value corresponding to each debug field value is produced, which not only reflects the inter-debug field value distance but also gives us a good statistical modelling of the entire violation report. Applying MDS on the above distance matrix may present the following examples of Table 6:

TABLE 6

| Debug Field Value Name | Encoded Value |
| --- | --- |
| top_pd_ss.power | 1.23 |
| top_pd_ss.ground | 3.67 |
| core2_pd_ss.power | 2.7 |
| core1_pd_ss.power | 3 |

4. Cluster Generation and Grading

Violation data generated as described above may be processed by three state-of-the-art ML algorithms: k-means, mean shift, and balanced iterative reducing and clustering using hierarchies (BIRCH) to generate clusters of violations. Each cluster itself may be a violation of type CLUSTER-_LP_VIOLATION, in some embodiments.

Once the modeling of categorical debug field values to numeric values is completed, Feature Selection may next be performed, where features may be acquired, such as direct features, or generated features (also called derived features) which may create a signature for each violation instance. In an embodiment, direct features may be debug fields, and generated features may be new fields which may sum up the information of multiple debug fields. In a direct feature, a debug field of a violation may be directly used as a feature, whereas in a derived or generated feature, multiple debug fields may be used to create a single feature, for example. For direct features, the encoded value of that debug field value may be directly used, and for generated or derived features, the value may be created from the encoded debug field values.

The above-mentioned violations of the ISO family may be characterized by the following features: SourceInfo/Power-Net, SourceInfo/GroundNet, SinkInfo/PowerNet, SinkInfo/PowerNet, StrategyNodePresent, SegmentSourceDomain, or SegmentSinkDomain. A feature value may be the encoded value of the corresponding debug field value in the violation report. In this manner, an N×M feature matrix may be attained (where N is the number of violations and M is feature size) as shown in the following Table 7:

TABLE 7

|  | SrcPwr | SrcGnd | SinkPwr | SinkGnd | Strategy<br>Node<br>Present | Seg-<br>Source<br>Domain | Seg-Sink<br>Domain |
| --- | --- | --- | --- | --- | --- | --- | --- |
| ISO_STRATEGY_<br>MISSING0 | 2.34 | 2.4 | 1.89 | 2.4 | 1 | 6.68 | 4.7 |
| ISO_STRATEGY_<br>MISSING1 | 2.34 | 2.4 | 1.89 | 2.4 | 1 | 6.68 | 4.7 |
| ISO_INST_<br>MISSING2 | 3.21 | 2.4 | 1.89 | 2.4 | 0 | 7.02 | 4.7 |

Once the N×M matrix is prepared, an automatic computer process may feed it to an appropriate clustering algorithm, such as one of the ML algorithms described below, to achieve a desired output. A given algorithm may be chosen based on its suitability for a given dataset, for example. Several clustering algorithms are available to cluster data points. Each of these algorithms works best only on certain types of datasets. Prior knowledge about datasets may facilitate a designer's task of deciding what algorithm to choose. But here, there is no prior knowledge about the data pattern. To solve this, a method is described in the following sections. A designer should have a good prior knowledge about the distribution of data, which is difficult to predict in most of the ML problems.

To solve that problem, instead of relying on a fixed clustering algorithm, a designer may consider a set of clustering algorithms, which perform well on most of the distributions in combination. In an embodiment, at least one of three algorithms may be chosen for this task, to name a few non-limiting examples: k-means, mean shift, or BIRCH, as mentioned above. In this manner, the data matrix may be fed to any or all of the selected clustering algorithms in the set in parallel.

The final output may be determined by grading the clusters on two essential metrics. The first is Silhouette Index, a scoring system which grades the cluster based on structural cohesion. The second is quality score, a domain-knowledge-based metric defined to measure how well the output fits the objective. A combination of these scores may define the final score of a clustering technique. The output with the highest combined score may be chosen and the result presented to the designer.

Once the cluster-set is refined by applying the above-mentioned process flow, the group of violations may be channelized (passed) to various static verification components to get the intelligent debug aid from the grouping information with the group of violations. This grouping information may be parsed by any tool capable of parsing the violations however they are formatted, e.g., XML, JSON, etc.

5. Determination and Display of Dominant Debug Fields for Each Violation Cluster Each cluster is processed to find out the violation fields that are primarily responsible for the creation of the given cluster. Intuitively, these are fields that may bind the violations of a given cluster together. The circuit designer needs to focus on these fields to debug the violations in the given cluster.

Given a violation cluster with K violations, suppose a field Foo occurs in all violations. That means in this cluster, Foo may have zero variance and is a dominant field. Suppose another field Foo' occurs only in a small % of the K violations. That means Foo' may not be a dominant field.

For each cluster, a set of fields with lowest variance will be chosen and presented to the user as dominant debug fields for the given cluster. The user may then focus on these fields to debug the root cause of the violations in the given cluster. The dominant fields of a cluster will be highlighted in Verdi Schematic Viewer on demand.

6. Determination & Display of Root-Causes for Each Violation Cluster

Referring to Section 2 above (describing 'enrichment or cloning of violations based on domain knowledge to facilitate root-cause analysis'), a step was described to generate cloned or enriched violations that may create high-quality clusters and automatically detect root-causes for violation clusters. In another embodiment, as described below, it may be possible, additionally or alternatively, to detect the potential root-causes for a given cluster automatically.

FIG. 4 depicts a cluster violation 400. Each field of a cluster violation is an original violation produced by a static verification tool.

In FIG. 4, LS_STRATEGY_REDUND may represent original violations from a UPF+DESIGN level. Violations DEBUG_PDLSPOL_REDUND, DEBUG_SUPPLY_ON and DEBUG_SUPPLY_UNUSED may represent original violations from a UPF level and thus may be the highest-level violations in this cluster. Domain knowledge may be used to determine which violations are highest-level violations, in some embodiments. Stages of each violation may already be defined in our static verification tools. Usually, violations of UPF stage may be chosen as high-level violations. A violation that cannot be considered an effect of some other cause violation is generally considered to be a highest-level violation.

Each cluster is processed by means of an algorithm to determine their highest-level violations. These highest-level violations may be the potential root-causes for the cluster.

7. Visualization

Often multiple violations may be mapped to a common root cause. In this manner, a specific design bug may eradicate several violations from the violation report. In an embodiment, details of data modeling are provided for VCLP violations and application of unsupervised ML to group the violations into clusters where each cluster is highly likely to have a common root cause.

Each violation may be characterized by its debug fields (or 'features'). Given a static verification-generated violation report, the categorical debug field values may be mapped to numeric values so that each violation may be represented as a point in Euclidean space, where a distance between two violations defines their affinity with respect to root cause. More specifically, affinity may generally be defined as having an inverse correlation with distance—thus, when modeling debug field values in Euclidean space according to the techniques described above, a smaller Euclidean distance between two given violations may signify a greater likelihood of those two violations belonging to the same cluster, and in turn may signify a higher probability of a shared root cause. Clustering algorithms may be used to group violations in such a way that, in a same cluster, violations may have a common root cause.

Figure 6:
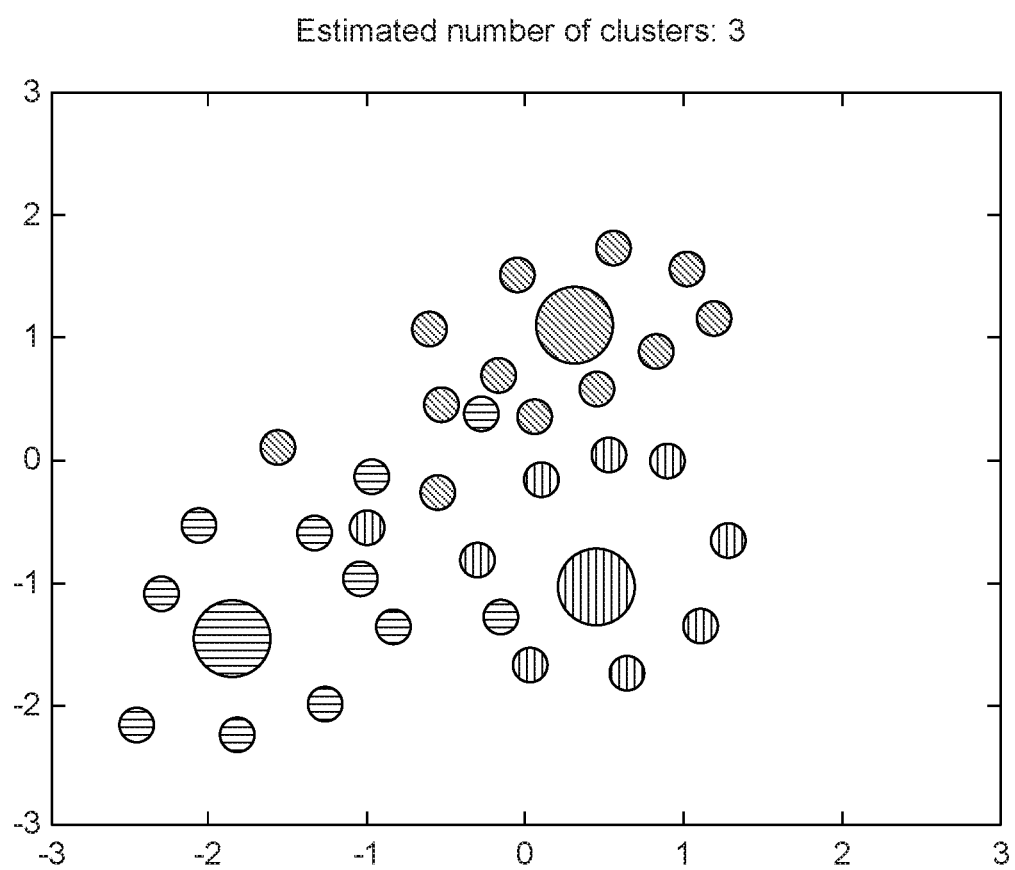
FIG. 6 depicts a violation cluster visualization in 2-D space.

Once the violation report is passed through the ML framework described above, output clusters of violations may be mapped and visualized in 2D space 600 as shown in FIG. 6.

Example Computer Systems

Various embodiments may be implemented, for example, using one or more well-known computer systems, such as computer system 700 shown in FIG. 7. One or more computer systems 700 may be used, for example, to implement any of the embodiments discussed herein, as well as combinations and sub-combinations thereof.

Computer system 700 may include one or more processors (also called central processing units, or CPUs), such as a processor 704. the processor may be, include, or be implemented using any of a microprocessor, graphics processing unit (GPU), or digital signal processor (DSP), or various electronic processing equivalents, such as an application specific integrated circuit (ASIC) or programmable logic device (PLD), such as a field programmable gate array (FPGA), among other embodiments. Processor 704 may be connected to a bus or communication infrastructure 706.

Computer system 700 may also include user input/output device(s) 703, such as monitors, keyboards, pointing devices, etc., which may communicate with communication infrastructure 706 through user input/output interface(s) 702.

One or more of processors 704 may be a graphics processing unit (GPU). In an embodiment, a GPU may be a processor that is a specialized electronic circuit designed to process mathematically intensive applications. The GPU may have a parallel structure that is efficient for parallel processing of large blocks of data, such as mathematically intensive data common to computer graphics applications, images, videos, vector processing, array processing, etc., as well as cryptography (including brute-force cracking), generating cryptographic hashes or hash sequences, solving partial hash-inversion problems, and/or producing results of other proof-of-work computations for some blockchain-based applications, for example.

Additionally, one or more of processors 704 may include a coprocessor or other implementation of logic for accelerating cryptographic calculations or other specialized mathematical functions, including hardware-accelerated cryptographic coprocessors. Such accelerated processors may further include instruction set(s) for acceleration using coprocessors and/or other logic to facilitate such acceleration.

Computer system 700 may also include a main or primary memory 708, such as random access memory (RAM). Main memory 708 may include one or more levels of cache. Main memory 708 may have stored therein control logic (i.e., computer software) and/or data.

Computer system 700 may also include one or more secondary storage devices or secondary memory 710. Secondary memory 710 may include, for example, a main storage drive 712 and/or a removable storage device or drive 714. Main storage drive 712 may be a hard disk drive or solid-state drive, for example. Removable storage drive 714 may be a floppy disk drive, a magnetic tape drive, a compact disk drive, an optical storage device, tape backup device, and/or any other storage device/drive.

Removable storage drive 714 may interact with a removable storage unit 718. Removable storage unit 718 may include a computer usable or readable storage device having stored thereon computer software (control logic) and/or data. Removable storage unit 718 may be a floppy disk, magnetic tape, compact disk, DVD, optical storage disk, and/any other computer data storage device. Removable storage drive 714 may read from and/or write to removable storage unit 718.

Secondary memory 710 may include other means, devices, components, instrumentalities or other approaches for allowing computer programs and/or other instructions and/or data to be accessed by computer system 700. Such means, devices, components, instrumentalities or other approaches may include, for example, a removable storage unit 722 and an interface 720. Examples of the removable storage unit 722 and the interface 720 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 700 may further include a communication or network interface 724. Communication interface 724 may enable computer system 700 to communicate and interact with any combination of external devices, external networks, external entities, etc. (individually and collectively referenced by reference number 728). For example, communication interface 724 may allow computer system 700 to communicate with external or remote devices 728 over communication path 726, which may be wired and/or wireless (or a combination thereof), and which may include any combination of LANs, WANs, the Internet, etc. Control logic and/or data may be transmitted to and from computer system 700 via communication path 726.

Computer system 700 may also be any of a personal digital assistant (PDA), desktop workstation, laptop or notebook computer, netbook, tablet, smart phone, smart watch or other wearable, appliance, part of the Internet of Things (IoT), and/or embedded system, to name a few non-limiting examples, or any combination thereof.

Computer system 700 may be a client or server, accessing or hosting any applications and/or data through any delivery paradigm, including but not limited to remote or distributed cloud computing solutions; local or on-premises software (e.g., "on-premise" cloud-based solutions); "as a service" models (e.g., content as a service (CaaS), digital content as a service (DCaaS), software as a service (SaaS), managed software as a service (MSaaS), platform as a service (PaaS), desktop as a service (DaaS), framework as a service (FaaS), backend as a service (BaaS), mobile backend as a service (MBaaS), infrastructure as a service (IaaS), database as a service (DBaaS), etc.); and/or a hybrid model including any combination of the foregoing examples or other services or delivery paradigms.

Any applicable data structures, file formats, and schemas may be derived from standards including but not limited to JavaScript Object Notation (JSON), Extensible Markup Language (XML), Yet Another Markup Language (YAML), Extensible Hypertext Markup Language (XHTML), Wireless Markup Language (WML), MessagePack, XML User Interface Language (XUL), or any other functionally similar representations alone or in combination. Alternatively, proprietary data structures, formats or schemas may be used, either exclusively or in combination with known or open standards.

Any pertinent data, files, and/or databases may be stored, retrieved, accessed, and/or transmitted in human-readable formats such as numeric, textual, graphic, or multimedia formats, further including various types of markup language, among other possible formats. Alternatively or in combination with the above formats, the data, files, and/or databases may be stored, retrieved, accessed, and/or transmitted in binary, encoded, compressed, and/or encrypted formats, or any other machine-readable formats.

Interfacing or interconnection among various systems and layers may employ any number of mechanisms, such as any number of protocols, programmatic frameworks, floorplans, or application programming interfaces (API), including but not limited to Document Object Model (DOM), Discovery Service (DS), NSUserDefaults, Web Services Description Language (WSDL), Message Exchange Pattern (MEP), Web Distributed Data Exchange (WDDX), Web Hypertext Application Technology Working Group (WHATWG) HTML5 Web Messaging, Representational State Transfer (REST or RESTful web services), Extensible User Interface Protocol (XUP), Simple Object Access Protocol (SOAP), XML Schema Definition (XSD), XML Remote Procedure Call (XML-RPC), or any other mechanisms, open or proprietary, that may achieve similar functionality and results.

Such interfacing or interconnection may also make use of uniform resource identifiers (URI), which may further include uniform resource locators (URL) or uniform resource names (URN). Other forms of uniform and/or unique identifiers, locators, or names may be used, either exclusively or in combination with forms such as those set forth above.

Any of the above protocols or APIs may interface with or be implemented in any programming language, procedural, functional, or object-oriented, and may be compiled or interpreted. Non-limiting examples include C, C++, C #, Objective-C, Java, Swift, Go, Ruby, Perl, Python, JavaScript, WebAssembly, or virtually any other language, with any other libraries or schemas, in any kind of framework, runtime environment, virtual machine, interpreter, stack, engine, or similar mechanism, including but not limited to Node.js, V8, Knockout, j Query, Dojo, Dijit, OpenUI5, AngularJS, Express.js, Backbone.js, Ember.js, DHTMLX, Vue, React, Electron, and so on, among many other non-limiting examples.

Computer system 700 may include hardware design tools, including but not limited to electronic design automation (EDA) and electronic computer-aided design (ECAD), which may further include capabilities of high-level synthesis, logic synthesis, simulation (physical, logical, and/or behavioral), analysis, and/or verification (physical, functional, and/or formal, including clock-domain crossing), among other related functionalities useful for circuit design or development of hardware, electronic or otherwise. Included hardware design tools may further include compilers, assemblers, and/or interpreters for hardware design languages including but not limited to VHDL, Verilog, SystemC, SpecC, SystemVerilog, and/or any high-level software language that may be translated or compiled to register-transfer level (RTL) hardware description or netlist, for example. Any of the above languages or equivalents may be used to specify hardware elements for implementing technology that may leverage the enhanced techniques described herein.

As used herein, the term "module" may signify a tangible data- or information-processing device, that may be limited in size or complexity. Additionally, a module may refer to at least one method or procedure to transform data or information, such as in a computer program. A module may also refer to a network of digital logic devices, such as gates, latches, flip-flops, and/or registers, for example, in which interconnections among logic devices may give structure to the network.

Methods or procedures forming a module, specified in a software-programming or hardware-description language, may be used to generate a specification for a network of digital logic devices to process data or information with repeatable results obtained from such methods or procedures. As used herein, the term "algorithm" may signify a sequence or set of operations or instructions that a module may use to transform data and information to achieve a result, which may be repeatable. A module may include one or more algorithm.

A module may be permanently configured (e.g., hardwired to form hardware), temporarily configured (e.g., programmed with software), or a combination of the two configurations (for example, a "structured ASIC" or other programmable logic device). Permanently configured modules, such as arithmetic logic units (ALUs), programmable logic arrays (PLAs), or read-only memories (ROMs), may be configured during manufacturing. Temporarily configured modules may be manufactured, for example, using field programmable gate arrays (FPGAs), random access memories (RAMs), or microprocessors, for example. A module may be configured to process data and information, typically using one or more sequence transformations (also referred to as operations) applied to the data or information, and/or transforming data or information by using, e.g., input address of memory that may stores output data or information, to perform aspects of the enhanced techniques disclosed herein.

Temporarily configured modules need not be configured at any one time. For example, a processor comprising one or more modules may have the one or more modules configured separately at different times. The processor may comprise a set of one or more modules at one particular time, and may comprise a different set of one or more modules at a different time. The decision to manufacture or implement a module in a permanently configured form, a temporarily configured form, or any combination of the two forms, may be driven by cost, time considerations, engineering constraints and/or specific design goals. The substance of a module's processing is independent of the form in which it may be manufactured or implemented.

In some embodiments, a tangible, non-transitory apparatus or article of manufacture comprising a tangible, non-transitory computer useable or readable medium having control logic (software) stored thereon may also be referred to herein as a computer program product or program storage device. This includes, but is not limited to, computer system 700, main memory 708, secondary memory 710, and removable storage units 718 and 722, as well as tangible articles of manufacture embodying any combination of the foregoing. Such control logic, when executed by one or more data processing devices (such as computer system 700), may cause such data processing devices to operate as described herein.

Conclusion

Based on the teachings contained in this disclosure, it may be apparent to persons skilled in the relevant art(s) how to make and use embodiments of this disclosure using data processing devices, computer systems and/or computer architectures other than that shown in FIG. 7. In particular, embodiments may operate with software, hardware, and/or operating system implementations other than those described herein.

It is to be appreciated that the Detailed Description section, and not any other section, is intended to be used to interpret the claims. Other sections may set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries may be defined as long as the specified functions and relationships (or equivalents thereof) are appropriately performed. Also, alternative embodiments may perform functional blocks, steps, operations, methods, etc. using orderings different from those described herein.

References herein to "one embodiment," "an embodiment," "an example embodiment," "some embodiments," or similar phrases, indicate that the embodiment described may include a particular feature, structure, or characteristic, but every embodiment may not necessarily include the particular feature, structure, or characteristic. Moreover, such phrases are not necessarily referring to the same embodiment.

Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

We claim:

1. A system for performing automated root-cause analysis, comprising:
   memory and at least one computer processor communicatively coupled with the memory and configured to perform operations comprising:
   selecting a seed debug field from among the plurality of debug fields in a report;
   creating a clone violation for a given combination of at least two additional debug fields, based at least in part on the seed debug field and a violation type;
   populating a projection matrix, based at least in part on mapping the violation to the clone violation;
   determining a violation cluster, based at least in part on the projection matrix; and
   generating a representation of the violation cluster.

2. The system of claim 1, the operations further comprising:
   grouping a plurality of violations, having a plurality of violation types, into one or more violation groups comprising a subset of the plurality of violations within the violation cluster, based on similarity of the numerical values corresponding to at least one debug field of the plurality of debug fields.

3. The system of claim 2, the operations further comprising:
   identifying a dominant violation field, from the at least one debug field of the plurality of debug fields, as corresponding to a root cause of at least the subset of the plurality of violations.

4. The system of claim 1, wherein the projection matrix comprises a table of unique field values for each violation of a given number of violations.

5. The system of claim 4, wherein the populating the projection matrix further comprises adding a zero-count axis to the table of unique field values.

6. The system of claim 1, wherein the determining comprises processing the representation via a mean-shift algorithm, k-means clustering algorithm, balanced iterative reducing and clustering using hierarchies (BIRCH) algorithm, or a combination thereof.

7. The system of claim 1, wherein the report comprises violation data representing the plurality of violations, wherein the violation data corresponds to at least one violation of a low-power specification, and wherein the violation data is formatted in accordance with Unified Power Format (UPF).

8. A computer-implemented method of automated root-cause analysis, comprising:
   selecting, by at least one computer processor, a seed debug field from among a plurality of debug fields in a report;
   creating, by the at least one computer processor, a clone violation for a given combination of at least two additional debug fields, based at least in part on the seed debug field and a violation type;
   populating, by the at least one computer processor, a projection matrix, based at least in part on mapping the violation to the clone violation;
   determining, by the at least one computer processor, a violation cluster, based at least in part on the projection matrix; and
   generating, by the at least one computer processor, a representation of the violation cluster.

9. The computer-implemented method of claim 8, further comprising:
   grouping, by the at least one computer processor, having a plurality of violation types, into one or more violation groups comprising a subset of the plurality of violations within the violation cluster, based on similarity of the numerical values corresponding to at least one debug field of the plurality of debug fields.

10. The computer-implemented method of claim 9, further comprising:
    identifying, by the at least one computer processor, a dominant violation field, from the at least one debug field of the plurality of debug fields, as corresponding to a root cause of at least the subset of the plurality of violations.

11. The computer-implemented method of claim 8, wherein the projection matrix comprises a table of unique field values for each violation of a given number of violations.

12. The computer-implemented method of claim 11, wherein the populating the projection matrix further comprises adding a zero-count axis to the table of unique field values.

13. The computer-implemented method of claim 8, wherein the determining comprises processing the representation via a mean-shift algorithm, k-means clustering algorithm, balanced iterative reducing and clustering using hierarchies (BIRCH) algorithm, or a combination thereof.

14. The computer-implemented method of claim 8, wherein the report comprises violation data representing the plurality of violations, wherein the violation data corresponds to at least one violation of a low-power specification, and wherein the violation data is formatted in accordance with Unified Power Format (UPF).

15. A non-transitory computer-readable storage device having instructions stored thereon, wherein the instructions, when executed, cause at least one computer processor to perform operations for automated root-cause analysis, the operations comprising:

selecting a seed debug field from among a plurality of debug fields in a report;

creating a clone violation for a given combination of at least two additional debug fields, based at least in part on the seed debug field and a violation type;

populating a projection matrix, based at least in part on mapping the violation to the clone violation;

determining a violation cluster, based at least in part on the projection matrix; and generating a representation of the violation cluster.

16. The non-transitory computer-readable storage device of claim 15, the operations further comprising:

grouping a plurality of violations, having a plurality of violation types, into one or more violation groups comprising a subset of the plurality of violations within the violation cluster, based on similarity of the numerical values corresponding to at least one debug field of the plurality of debug fields.

17. The non-transitory computer-readable storage device of claim 16, the operations further comprising:

identifying a dominant violation field, from the at least one debug field of the plurality of debug fields, as corresponding to a root cause of at least the subset of the plurality of violations.

18. The non-transitory computer-readable storage device of claim 15, wherein the projection matrix comprises a table of unique field values for each violation of a given number of violations.

19. The non-transitory computer-readable storage device of claim 18, wherein the populating the projection matrix further comprises adding a zero-count axis to the table of unique field values.

20. The non-transitory computer-readable storage device of claim 15, wherein the determining comprises processing the representation via a mean-shift algorithm, k-means clustering algorithm, balanced iterative reducing and clustering using hierarchies (BIRCH) algorithm, or a combination thereof.

* * * * *